(12) United States Patent
Suzuki

(10) Patent No.: US 9,194,494 B2
(45) Date of Patent: Nov. 24, 2015

(54) SPARK PLUG

(75) Inventor: Akira Suzuki, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/131,410

(22) PCT Filed: Apr. 17, 2012

(86) PCT No.: PCT/JP2012/002640
§ 371 (c)(1),
(2), (4) Date: Jan. 7, 2014

(87) PCT Pub. No.: WO2013/008371
PCT Pub. Date: Jan. 17, 2013

(65) Prior Publication Data
US 2014/0145405 A1    May 29, 2014

(30) Foreign Application Priority Data
Jul. 11, 2011 (JP) .................................. 2011-152782

(51) Int. Cl.
*H01T 13/20* (2006.01)
*F16J 15/06* (2006.01)
*F16J 15/08* (2006.01)
*H01T 13/08* (2006.01)

(52) U.S. Cl.
CPC ............ *F16J 15/061* (2013.01); *F16J 15/0881* (2013.01); *H01T 13/08* (2013.01)

(58) Field of Classification Search
CPC ...... F16J 15/061; F16J 15/0881; H01T 13/08; H01T 13/36

USPC .................................................. 313/118–145
See application file for complete search history.

(56) References Cited

U.S. PATENT DOCUMENTS

| 3,254,154 | A | 5/1966 | Boggs |
| 6,769,697 | B1 | 8/2004 | Ishikawa et al. |
| 2003/0107188 | A1 | 6/2003 | Spence et al. |
| 2003/0164594 | A1 | 9/2003 | Whitlow et al. |
| 2006/0284535 | A1* | 12/2006 | Ozeki et al. .................... 313/143 |

(Continued)

FOREIGN PATENT DOCUMENTS

| EP | 1707936 A1 | 10/2006 |
| EP | 1850432 A2 | 10/2007 |

(Continued)

OTHER PUBLICATIONS

ISA/JPO, International Search Report issued in corresponding application PCT/JP2012/002640, mailed Jul. 24, 2012.

(Continued)

*Primary Examiner* — Donald Raleigh
(74) *Attorney, Agent, or Firm* — Stites & Harbison, PLLC; Jeffrey A. Haeberlin; James R. Hayne

(57) ABSTRACT

Provided is a technique which realizes securement of gastightness and suppression of loosening of a gasket. A spark plug includes a tubular metallic shell extending in an axial direction, and an annular gasket provided around the metallic shell. The gasket is solid and contains copper as a main component and nickel in an amount of 0.1 wt. % or more. The gasket has a maximum thickness of 0.4 mm or more in the axial direction, and the gasket has a Vickers hardness of 30 HV to 150 HV.

7 Claims, 7 Drawing Sheets

(56) References Cited

U.S. PATENT DOCUMENTS

| | | |
|---|---|---|
| 2008/0098974 A1 | 5/2008 | Fukuzawa et al. |
| 2008/0203882 A1 | 8/2008 | Kobayashi et al. |

FOREIGN PATENT DOCUMENTS

| | | |
|---|---|---|
| GB | 2382851 A | 6/2003 |
| JP | S54-113690 U | 8/1979 |
| JP | H06-283249 A | 10/1994 |
| JP | 11-351393 A | 12/1999 |
| JP | 2006-307835 A | 11/2006 |
| JP | 2008-135370 A | 6/2008 |
| JP | 2008-210681 A | 9/2008 |
| JP | 4272682 B2 | 6/2009 |
| WO | 03/071171 A1 | 8/2003 |

OTHER PUBLICATIONS

Japanese Patent Office, Notification of Reasons for Refusal, issued in corresponding Japanese application No. 2013-047688, dispatched Feb. 17, 2015.

European Patent Office, Extended European Search Report, issued in corresponding European application No. 12810850.3, dated Jan. 29, 2015.

* cited by examiner

| Condition # | Maximum thickness Tmax (mm) | Hardness (HV) | Ni (wt%) | Sn (Wt%) | P (wt%) | Evaluation of gas-tightness |
|---|---|---|---|---|---|---|
| A1 | 0.2 | 80 | 1.0 | 0.0 | 0.0 | C |
| A2 | 0.3 | 80 | 1.0 | 0.0 | 0.0 | C |
| A3 | 0.4 | 80 | 1.0 | 0.0 | 0.0 | A |
| A4 | 0.5 | 80 | 1.0 | 0.0 | 0.0 | A |
| A5 | 0.8 | 80 | 1.0 | 0.0 | 0.0 | A |
| A6 | 1.0 | 80 | 1.0 | 0.0 | 0.0 | A |
| A7 | 1.5 | 80 | 1.0 | 0.0 | 0.0 | A |
| A8 | 1.8 | 80 | 1.0 | 0.0 | 0.0 | A |
| A9 | 2.0 | 80 | 1.0 | 0.0 | 0.0 | A |
| A10 | 2.5 | 80 | 1.0 | 0.0 | 0.0 | A |
| A11 | 0.3 | 150 | 1.0 | 0.0 | 0.0 | C |
| A12 | 0.3 | 30 | 1.0 | 0.0 | 0.0 | B |
| A13 | 1.5 | 160 | 1.0 | 0.0 | 0.0 | B |
| A14 | 2.5 | 160 | 1.0 | 0.0 | 0.0 | B |
| A15 | 1.5 | 150 | 1.0 | 0.0 | 0.0 | A |
| A16 | 2.5 | 150 | 1.0 | 0.0 | 0.0 | A |
| A17 | 0.3 | 80 | 0.1 | 0.0 | 0.0 | C |
| A18 | 0.4 | 80 | 0.1 | 0.0 | 0.0 | A |
| A19 | 1.5 | 80 | 0.1 | 0.0 | 0.0 | A |
| A20 | 2.5 | 80 | 0.1 | 0.0 | 0.0 | A |
| A21 | 1.5 | 150 | 0.1 | 0.0 | 0.0 | A |
| A22 | 1.5 | 160 | 0.1 | 0.0 | 0.0 | B |
| A23 | 0.3 | 80 | 10.0 | 0.0 | 0.0 | C |
| A24 | 0.4 | 80 | 10.0 | 0.0 | 0.0 | A |
| A25 | 1.5 | 80 | 10.0 | 0.0 | 0.0 | A |
| A26 | 2.5 | 80 | 10.0 | 0.0 | 0.0 | A |
| A27 | 1.5 | 150 | 10.0 | 0.0 | 0.0 | A |
| A28 | 1.5 | 160 | 10.0 | 0.0 | 0.0 | B |
| A29 | 1.5 | 80 | 1.0 | 0.3 | 0.5 | A |
| A30 | 1.5 | 80 | 1.0 | 1.0 | 0.5 | A |
| A31 | 1.5 | 80 | 1.0 | 11.0 | 0.5 | A |
| A32 | 1.5 | 80 | 0.1 | 0.3 | 0.5 | A |
| A33 | 1.5 | 80 | 0.1 | 1.0 | 0.5 | A |
| A34 | 1.5 | 80 | 0.1 | 11.0 | 0.5 | A |
| A35 | 1.5 | 80 | 10.0 | 0.3 | 0.5 | A |
| A36 | 1.5 | 80 | 10.0 | 1.0 | 0.5 | A |
| A37 | 1.5 | 80 | 10.0 | 11.0 | 0.5 | A |

FIG. 4

| Condition # | Maximum thickness Tmax (mm) | Hardness (HV) | Ni (wt%) | Sn (Wt%) | P (wt%) | Evaluation of loosening |
|---|---|---|---|---|---|---|
| B1 | 1.5 | 80 | 0.00 | 0.0 | 0.00 | C |
| B2 | 1.5 | 80 | 0.02 | 0.0 | 0.00 | C |
| B3 | 1.5 | 80 | 0.05 | 0.0 | 0.00 | C |
| B4 | 1.5 | 80 | 0.10 | 0.0 | 0.00 | A |
| B5 | 1.5 | 80 | 0.30 | 0.0 | 0.00 | A |
| B6 | 1.5 | 80 | 0.50 | 0.0 | 0.00 | A |
| B7 | 1.5 | 80 | 1.00 | 0.0 | 0.00 | A |
| B8 | 1.5 | 80 | 3.00 | 0.0 | 0.00 | A |
| B9 | 1.5 | 80 | 5.00 | 0.0 | 0.00 | A |
| B10 | 1.5 | 80 | 10.00 | 0.0 | 0.00 | A |
| B11 | 1.5 | 80 | 0.05 | 0.2 | 0.00 | C |
| B12 | 1.5 | 80 | 0.10 | 0.2 | 0.00 | A |
| B13 | 1.5 | 80 | 0.05 | 11.0 | 0.00 | C |
| B14 | 1.5 | 80 | 0.10 | 11.0 | 0.00 | A |
| B15 | 0.4 | 80 | 0.10 | 0.0 | 0.00 | A |
| B16 | 2.5 | 80 | 0.10 | 0.0 | 0.00 | A |
| B17 | 1.5 | 30 | 0.10 | 0.0 | 0.00 | A |
| B18 | 1.5 | 150 | 0.10 | 0.0 | 0.00 | A |
| B19 | 1.5 | 80 | 1.00 | 0.0 | 0.01 | AA |
| B20 | 1.5 | 80 | 1.00 | 0.0 | 0.05 | AA |
| B21 | 1.5 | 80 | 1.00 | 0.0 | 0.10 | AA |
| B22 | 1.5 | 80 | 1.00 | 0.0 | 0.50 | AA |
| B23 | 1.5 | 80 | 0.05 | 0.2 | 0.50 | C |
| B24 | 1.5 | 80 | 0.10 | 0.2 | 0.01 | AA |
| B25 | 1.5 | 80 | 0.05 | 11.0 | 0.50 | C |
| B26 | 1.5 | 80 | 0.10 | 11.0 | 0.01 | AA |
| B27 | 0.4 | 80 | 1.00 | 0.0 | 0.01 | AA |
| B28 | 2.5 | 80 | 1.00 | 0.0 | 0.01 | AA |
| B29 | 1.5 | 30 | 1.00 | 0.0 | 0.01 | AA |
| B30 | 1.5 | 150 | 1.00 | 0.0 | 0.01 | AA |
| B31 | 1.5 | 20 | 0.10 | 0.0 | 0.00 | C |
| B32 | 1.5 | 20 | 10.00 | 0.0 | 0.00 | C |
| B33 | 1.5 | 20 | 0.10 | 0.0 | 0.50 | C |
| B34 | 1.5 | 20 | 10.00 | 0.0 | 0.50 | C |
| B35 | 1.5 | 30 | 0.10 | 0.0 | 0.00 | A |
| B36 | 1.5 | 30 | 10.00 | 0.0 | 0.00 | A |
| B37 | 1.5 | 30 | 0.10 | 0.0 | 0.50 | AA |
| B38 | 1.5 | 30 | 10.00 | 0.0 | 0.50 | AA |

FIG. 5

| Condition # | Maximum thickness Tmax (mm) | Hardness (HV) | Ni (wt%) | Sn (Wt%) | P (wt%) | Evaluation of screwing accuracy |
|---|---|---|---|---|---|---|
| C1 | 1.5 | 80 | 1.0 | 0.0 | 0.05 | C |
| C2 | 1.5 | 80 | 1.0 | 0.1 | 0.05 | C |
| C3 | 1.5 | 80 | 1.0 | 0.2 | 0.05 | C |
| C4 | 1.5 | 80 | 1.0 | 0.3 | 0.05 | A |
| C5 | 1.5 | 80 | 1.0 | 0.4 | 0.05 | A |
| C6 | 1.5 | 80 | 1.0 | 0.8 | 0.05 | A |
| C7 | 1.5 | 80 | 1.0 | 1.2 | 0.05 | A |
| C8 | 1.5 | 80 | 1.0 | 3.0 | 0.05 | A |
| C9 | 1.5 | 80 | 1.0 | 5.0 | 0.05 | A |
| C10 | 1.5 | 80 | 1.0 | 11.0 | 0.05 | A |
| C11 | 2.5 | 30 | 1.0 | 0.3 | 0.05 | A |
| C12 | 0.4 | 30 | 1.0 | 0.3 | 0.05 | A |
| C13 | 2.5 | 150 | 1.0 | 0.3 | 0.05 | A |
| C14 | 0.4 | 150 | 1.0 | 0.3 | 0.05 | A |
| C15 | 1.5 | 80 | 0.1 | 0.3 | 0.05 | A |
| C16 | 1.5 | 80 | 10.0 | 0.3 | 0.05 | A |
| C17 | 1.5 | 80 | 1.0 | 0.3 | 0.01 | A |
| C18 | 1.5 | 80 | 1.0 | 0.3 | 0.50 | A |

FIG. 6

| Contact area S [mm²] | Outer diameter [mm] | Type 1 (containing no Ni) Number of samples exhibiting loosening | Type 2 (containing Ni) Number of samples exhibiting loosening | Number of samples exhibiting improvement |
|---|---|---|---|---|
| 140 | 16.4 | 15/30 | 0/30 | 15 |
| 130 | 16.0 | 15/30 | 0/30 | 15 |
| 120 | 15.6 | 16/30 | 0/30 | 16 |
| 111 | 15.2 | 26/30 | 0/30 | 26 |
| 101 | 14.8 | 26/30 | 0/30 | 26 |
| 92 | 14.4 | 27/30 | 0/30 | 27 |
| 83 | 14.0 | 28/30 | 0/30 | 28 |

SPARK PLUG

TECHNICAL FIELD

The present invention relates to a spark plug.

BACKGROUND ART

In recent years, increasing demand has arisen for improvement of the fuel consumption of engines for automobiles. Since an important point for fuel consumption improvement is the attachment accuracy of a spark plug to an engine, demand has arisen for improvement of the attachment accuracy. Requirements for attachment accuracy improvement include, for example, the amount of protrusion of a spark plug into a combustion chamber, and the direction of an outer electrode (ground electrode) of a spark plug.

Hitherto, a gasket having a hollow structure has been replaced by a gasket formed of an annular plate material for the purpose of improving the attachment accuracy of a spark plug. A known technique regarding a gasket formed of a plate material is disclosed in, for example, Patent Document 1. However, this technique is insufficiently devised in terms of securement of gas-tightness and suppression of loosening.

PRIOR ART DOCUMENT

Patent Document

Patent Document 1: JP2008-210681A
Patent Document 2: JP-H11-351393A
Patent Document 3: JP4272682B
Patent Document 4: EP1850432-A2

SUMMARY OF THE INVENTION

Problems to be Solved by the Invention

The present invention has been accomplished for solving the aforementioned conventional problems at least partially, and an object of the present invention is to provide a technique which realizes securement of gas-tightness and suppression of loosening of a gasket.

Means for Solving the Problems

The present invention has been accomplished for solving the aforementioned problems at least partially, and may be carried out in the following modes or application examples.

Application Example 1

A spark plug comprising a tubular metallic shell extending in an axial direction, and an annular gasket provided around the metallic shell, the spark plug being characterized in that the gasket is solid, contains copper as a main component, and contains nickel in an amount of 0.10 wt. % or more; the gasket has a maximum thickness of 0.4 mm or more in the axial direction; and the gasket has a Vickers hardness of 30 HV to 150 HV.

Application Example 2

A spark plug according to application example 1, wherein the gasket further contains phosphorus in an amount of 0.01 wt. % to 0.50 wt. %.

Application Example 3

A spark plug according to application example 1 or 2, wherein the gasket further contains tin in an amount of 0.30 wt. % to 11.00 wt. %.

Application Example 4

A spark plug according to any one of application examples 1 to 3, wherein the gasket contains one or more elements selected from among nickel, phosphorus, and tin, the one or more elements including at least nickel; and the total amount of the one or more elements is 2.00 wt. % or less.

Application Example 5

A spark plug according to any one of application examples 1 to 4, wherein the gasket has a surface which is in contact with the metallic shell and which has an area of 111 mm$^2$ or less.

The present invention may be carried out in various modes; for example, in a mode of a spark plug production method or a spark plug production apparatus.

Effects of the Invention

According to the configuration of application example 1, since the gasket has an appropriate hardness and an appropriate thickness, gas-tightness can be secured. In addition, since the gasket contains an appropriate amount of nickel, the gasket exhibits improved stress relaxation resistance, and loosening of the gasket can be suppressed.

According to the configuration of application example 2, since the gasket exhibits improved stress relaxation resistance, loosening of the gasket can be further suppressed.

According to the configuration of application example 3, the gasket exhibits increased elasticity. Therefore, even when the spark plug is temporarily removed from an engine head and then screwed thereinto again, the spark plug exhibits enhanced screwing accuracy.

According to the configuration of application example 4, since a reduction in thermal conductivity of the gasket can be suppressed, loosening of the gasket can be further suppressed.

In the spark plug having the configuration according to application example 5, loosening of the gasket can be effectively suppressed.

BRIEF DESCRIPTION OF THE DRAWINGS

FIG. 4 shows, in a table form, evaluation results of gas-tightness.

FIG. 5 shows, in a table form, evaluation results of loosening.

FIG. 6 shows, in a table form, evaluation results of screwing accuracy.

MODES FOR CARRYING OUT THE INVENTION

A mode of the present invention will next be described with reference to embodiments, which will be shown in the following order: A. first embodiment; B. second embodiment; C. experimental examples; C1. experimental example on gas-tightness; C2. experimental example 1 on loosening; C3. experimental example on screwing accuracy; C4. experimental example 2 on loosening; and D. modifications.

A. First Embodiment

Figure 1:
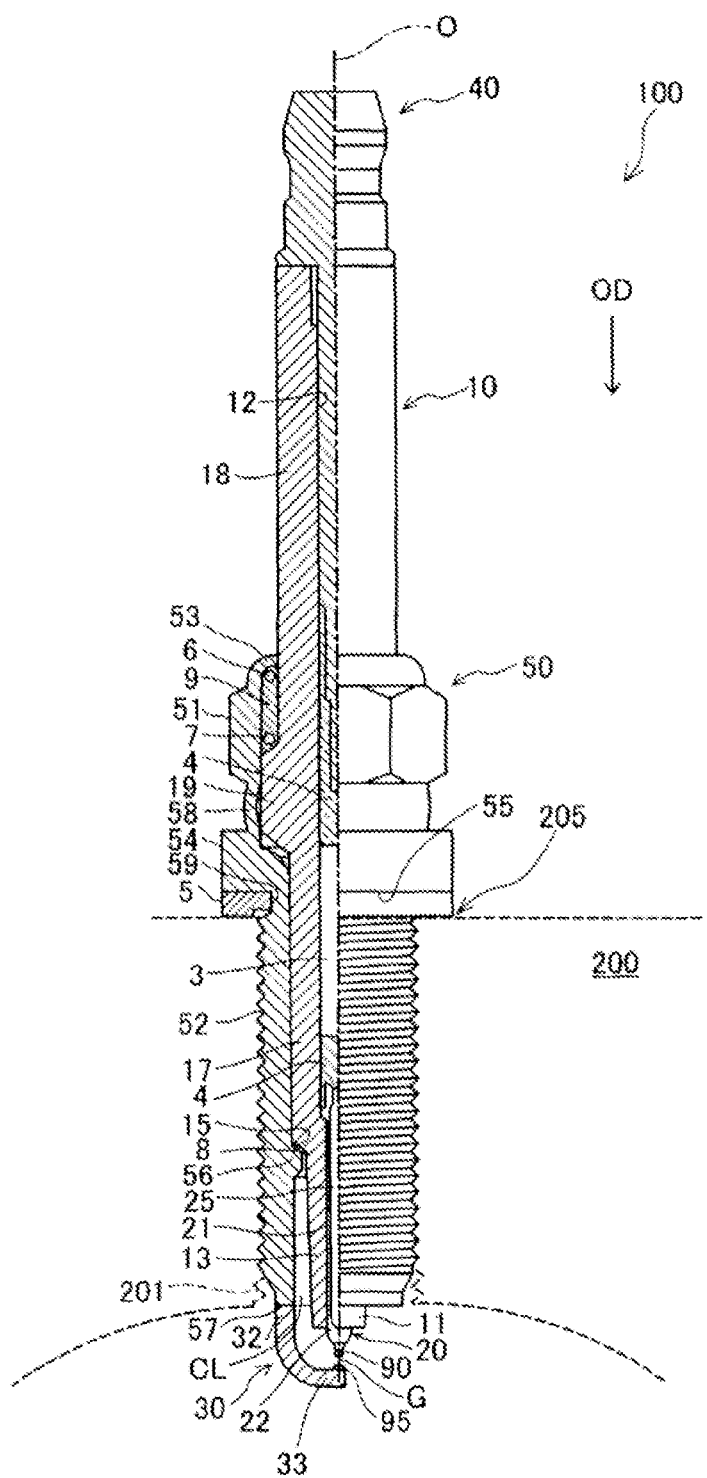
FIG. 1 is a partial cross-sectional view of a spark plug according to one embodiment of the present invention.

FIG. 1 is a partial cross-sectional view of a spark plug 100 according to one embodiment of the present invention. In FIG. 1, the axial direction OD of the spark plug 100 is referred to as the vertical direction. In the following description, the lower side of the spark plug 100 is referred to as the forward end side of the spark plug 100, and the upper side as the rear end side.

The spark plug 100 includes an insulator 10, a metallic shell 50, a center electrode 20, a ground electrode 30, and a terminal shell 40. The center electrode 20 is held in the insulator 10 so as to extend in the axial direction OD. The insulator 10, which serves as an insulating material, is inserted in the metallic shell 50. The terminal shell 40 is provided at the rear end of the insulator 10.

The insulator 10, which has a tubular shape, is formed through firing of alumina or the like, and has, in the center thereof, an axial hole 12 extending in the axial direction OD. The insulator 10 has, in the vicinity of its center in the axial direction OD, a flange portion 19 having the largest outer diameter. A rear-end-side body portion 18 is provided on the rear end side (upper side of FIG. 1) with respect to the flange portion 19. A forward-end-side body portion 17 having an outer diameter smaller than that of the rear-end-side body portion 18 is provided on the forward end side (lower side of FIG. 1) with respect to the flange portion 19. Furthermore, an elongated leg portion 13 having an outer diameter smaller than that of the forward-end-side body portion 17 is provided at the forward end of the forward-end-side body portion 17. When the spark plug 100 is attached to an engine head 200 of an internal combustion engine, the elongated leg portion 13, whose diameter decreases toward the forward end, is exposed to a combustion chamber of the internal combustion engine. A support portion 15 is provided between the elongated leg portion 13 and the forward-end-side body portion 17.

The metallic shell 50, which has a circular tubular shape, is formed of low-carbon steel material, and is employed for fixing the spark plug 100 to the engine head 200 of the internal combustion engine. The metallic shell 50 holds therein the insulator 10, and a portion of the insulator 10 (including a part of the rear-end-side body portion 18 and the elongated leg portion 13) is surrounded by the metallic shell 50.

The metallic shell 50 has a tool engagement portion 51 and a threaded attachment portion 52. The tool engagement portion 51 is fitted with a spark plug wrench (not illustrated). The threaded attachment portion 52 of the metallic shell 50 has a thread and is screwed into a threaded attachment hole 201 of the engine head 200 provided at the upper portion of the internal combustion engine. In the present embodiment, the threaded attachment portion 52 has a thread diameter of M12.

A flange-like sealing portion 54 is provided between the tool engagement portion 51 and the threaded attachment portion 52 of the metallic shell 50. An annular gasket 5 is fitted to the outer periphery of the metallic shell 50; more specifically, the gasket 5 is fitted to a screw neck 59 provided between the threaded attachment portion 52 and the sealing portion 54. By means of the gasket 5, sealing is achieved between the spark plug 100 and the engine head 200, and gas-tightness of the engine is secured via the threaded attachment hole 201. The gasket 5 will be described below in detail.

A thin crimp portion 53 is provided on the rear end side of the metallic shell 50 with respect to the tool engagement portion 51. As in the case of the crimp portion 53, a thin buckling portion 58 is provided between the sealing portion 54 and the tool engagement portion 51. Annular ring members 6 and 7 are provided between the inner wall of the metallic shell 50 (from the tool engagement portion 51 to the crimp portion 53) and the outer wall of the rear-end-side body portion 18 of the insulator 10. Furthermore, powder of talc 9 is charged between the ring members 6 and 7. When the crimp portion 53 is bent radially inward; i.e., the metallic shell 50 is crimped radially inward, the insulator 10 is pressed toward the forward end of the metallic shell 50 via the ring members 6 and 7 and the talc 9. Thus, the support portion 15 of the insulator 10 is supported by a stepped portion 56 provided on the inner wall of the metallic shell 50, and the metallic shell 50 and the insulator 10 are integrated together. With this configuration, gas-tightness between the metallic shell 50 and the insulator 10 is maintained by means of an annular plate packing 8 provided between the support portion 15 of the insulator 10 and the stepped portion 56 of the metallic shell 50, whereby leakage of combustion gas is prevented. The plate packing 8 is formed of, for example, a material having high thermal conductivity, such as copper or aluminum. When the plate packing 8 has high thermal conductivity, since heat from the insulator 10 is effectively transferred to the stepped portion 56 of the metallic shell 50, the spark plug 100 exhibits favorable heat dissipation, and thus heat resistance can be improved. The buckling portion 58 is formed so as to bend and deform outward in association with an increase in compression force during crimping, whereby the gas-tightness in the metallic shell 50 is enhanced by increased compression stroke of the talc 9. A clearance CL of specific dimensions is provided between a forward-end-side portion of the metallic shell 50 (with respect to the stepped portion 56) and the insulator 10.

The center electrode 20, which is a rod-like electrode, has a structure including an electrode matrix 21, and a core member 25 embedded in the electrode matrix 21. The electrode matrix 21 is formed of nickel or an alloy containing nickel as a main component, such as Inconel (trade name) 600 or 601. The core member 25 is formed of a material having thermal conductivity higher than that of the electrode matrix 21; i.e., the core member 25 is formed of copper or an alloy containing copper as a main component. Generally, the center electrode 20 is produced by charging the core member 25 into the electrode matrix 21 having a bottomed tubular shape, and elongating the matrix 21 (from the bottom side) through extrusion molding. The core member 25 has, at its body portion, a generally constant outer diameter, and has a decreased diameter portion on the forward end side. The center electrode 20 extends in the axial hole 12 toward the rear end side, and is electrically connected to the terminal shell 40 via a sealing body 4 and a ceramic resistor 3. The terminal shell 40 is connected to a high-voltage cable (not illustrated) via a plug cap (not illustrated), whereby high voltage is applied to the spark plug.

A forward end portion 22 of the center electrode 20 projects from a forward end portion 11 of the insulator 10. A center electrode tip 90 is bonded to the end of the forward end portion 22 of the center electrode 20. The center electrode tip 90 extends in the axial direction OD and has a generally circular columnar shape. The center electrode tip 90 is formed of a high-melting-point noble metal for improving the spark erosion resistance thereof. The center electrode tip 90 is formed of, for example, iridium (Ir), or an Ir alloy containing Ir as a main component and also containing one element or two or more elements selected from among platinum (Pt), rhodium (Rh), ruthenium (Ru), palladium (Pd), and rhenium (Re).

The ground electrode 30 is formed of a metal having high corrosion resistance; for example, a nickel alloy such as Inconel (trade name) 600 or 601. A proximal portion 32 of the ground electrode 30 is bonded to a forward end portion 57 of the metallic shell 50 through welding. The ground electrode 30 is bent such that a distal end portion 33 of the ground electrode 30 faces the center electrode tip 90.

A ground electrode tip 95 is bonded to the distal end portion 33 of the ground electrode 30. The ground electrode tip 95 faces the center electrode tip 90, and a spark discharge gap G is provided between the ground electrode tip 95 and the center electrode tip 90. The ground electrode tip 95 may be formed of a material similar to that employed for the center electrode tip 90.

Figure 2:
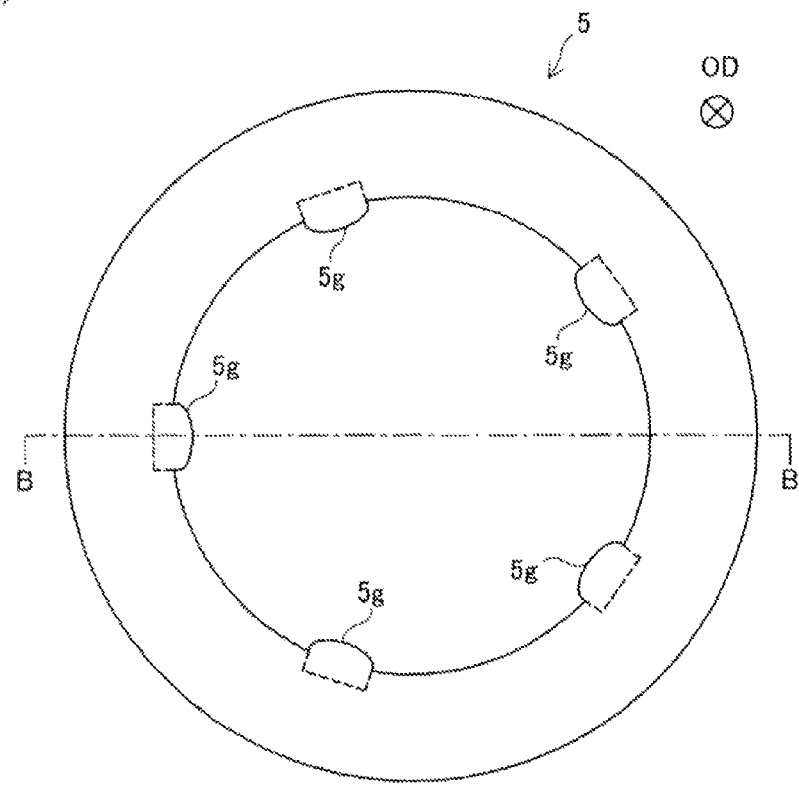
FIG. 2 shows the configuration of a gasket.
Figure 2:
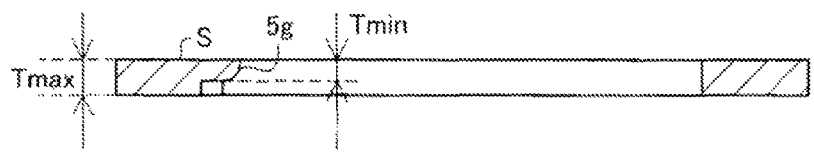

FIG. 2 shows the configuration of the gasket 5. (A) of FIG. 2 is a plan view of the gasket 5, and (B) of FIG. 2 is a cross-sectional view of the gasket 5 of (A) of FIG. 2 taken along line B-B.

As shown in (B) of FIG. 2, the gasket 5 is solid. As used herein, the term "solid" refers to the case where a product has no hollow portion; specifically, for example, the product is not produced by bending a plate so that a hollow portion is provided in the interior of the product.

The gasket 5 contains copper (Cu) as a main component, and also contains nickel (Ni) in an amount of 0.1 wt. % or more. Since strength, elasticity, and stress relaxation resistance are improved through addition of Ni to Cu, loosening of the gasket can be suppressed. The reason for this will be described hereinbelow with reference to experimental examples. As used herein, the term "main component" refers to a component which is contained in an amount of 50 wt. % or more. As used herein, the term "stress relaxation resistance" refers to resistance to a decrease in stress. The lower the percent stress relaxation, the better the stress relaxation resistance.

In the present embodiment, the gasket 5 has a maximum thickness Tmax of 0.4 mm in the axial direction OD. When the maximum thickness Tmax of the gasket 5 is 0.4 mm or more, the gas-tightness of the gasket 5 can be secured. The reason for this will be described hereinbelow with reference to experimental examples. Preferably, the gasket 5 has a minimum thickness Tmin of 0.2 mm or more in the axial direction OD.

In the present embodiment, the gasket 5 has a Vickers hardness (hereinafter may be referred to simply as "hardness") of 80 HV. When the hardness of the gasket 5 is 30 HV to 150 HV, loosening of the gasket can be suppressed while gas-tightness is secured. The reason for this will be described hereinbelow with reference to experimental examples.

In order to adjust the hardness of the gasket 5 to 30 HV to 150 HV, annealing is carried out under the following conditions: annealing temperature: 300 to 600° C., annealing time: 30 to 90 minutes.

In the present embodiment, the gasket 5 further contains phosphorus (P) in an amount of 0.01 wt. % to 0.50 wt. %. When P is incorporated, a segregation product containing Ni and P is produced, and thus the gasket 5 exhibits improved stress relaxation resistance. Therefore, loosening of the gasket 5 can be further suppressed. The reason for this will be described hereinbelow with reference to experimental examples.

In the present embodiment, the gasket 5 further contains tin (Sn) in an amount of 0.3 wt. % to 11.0 wt. %. When Sn is incorporated, Sn forms a solid solution in a copper matrix, and thus the gasket 5 exhibits improved strength and elasticity. Therefore, screwing accuracy upon repeated screwing/unscrewing can be improved. The reason for this will be described hereinbelow with reference to experimental examples.

In the present embodiment, the gasket 5 contains the three elements: nickel, phosphorus, and tin in a total amount of 2.0 wt. % or less. In this case, since a reduction in thermal conductivity of the gasket 5 can be suppressed, loosening of the gasket 5 can be further suppressed.

In the present embodiment, five protrusions 5g are provided on an inner peripheral portion of the gasket 5. These protrusions 5g are formed through partial deformation of the inner peripheral portion by pressing the gasket 5 by means of a jig in a direction opposite the axial direction OD after fitting of the gasket 5 onto the spark plug 100. In the case where these protrusions 5g are formed, when the spark plug 100 is not attached to the engine head, removal of the gasket 5 from the spark plug 100 can be prevented.

Thus, in the first embodiment, since the thickness, hardness, and material of the solid gasket 5 are appropriately determined, loosening of the gasket can be suppressed while gas-tightness is secured. Particularly, even when the area S of a surface of the gasket 5 which is in contact with the metallic shell 50 (hereinafter the area S may be referred to as "contact area S") is small; specifically, even when the contact area S is 111 $mm^2$ or less, loosening of the gasket can be effectively suppressed. The reason for determination of a specific value of the contact area S will be described hereinbelow. The significant figures of element content shown in the present specification and drawings are two decimal places.

B. Second Embodiment

Figure 3:
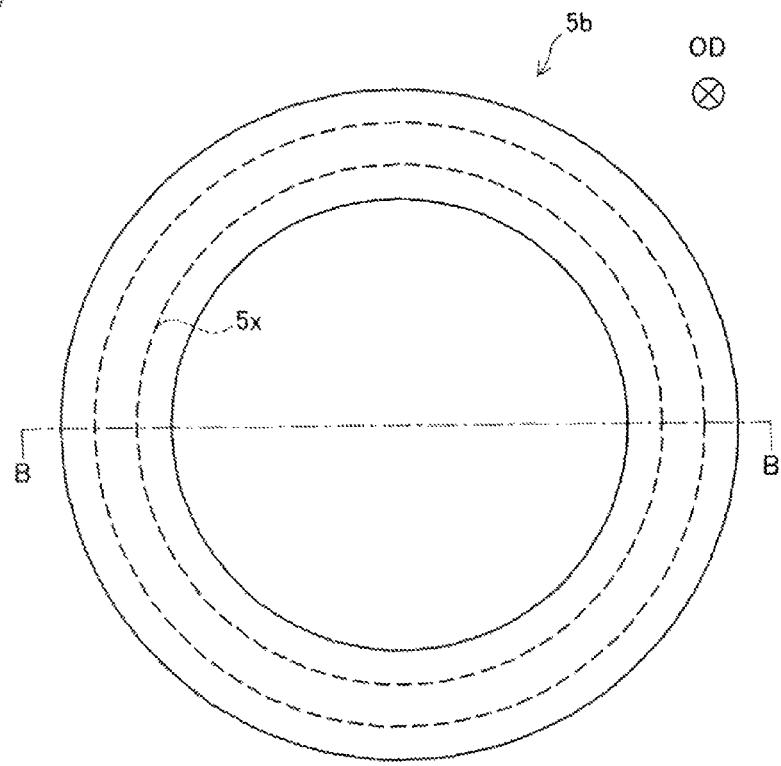
FIG. 3 shows the configuration of a gasket according to a second embodiment.
Figure 3:
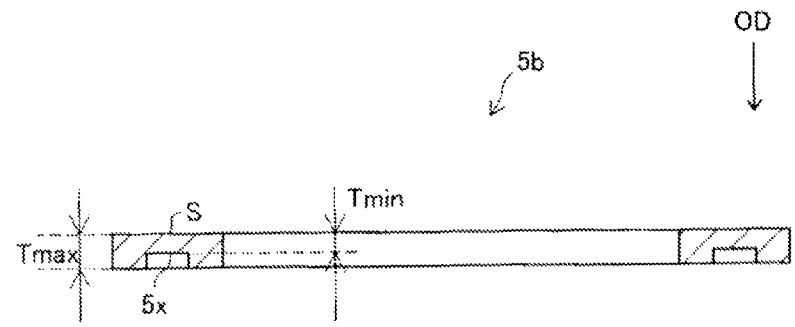

FIG. 3 shows the configuration of a gasket 5b according to a second embodiment. The gasket 5b has the same configuration as the gasket of the first embodiment shown in FIG. 2, except that an annular groove 5x is provided in place of the protrusions 5g. The groove 5x is formed through deformation of the gasket 5b by pressing it by means of a jig in a direction opposite the axial direction OD after fitting of the gasket 5b onto the spark plug 100. When the groove 5x is formed, the inner diameter of the gasket 5b is reduced. Therefore, when the spark plug 100 is not attached to the engine head, removal of the gasket 5b from the spark plug 100 can be prevented. As in the case of the first embodiment, this configuration realizes securement of gas-tightness and suppression of loosening of the gasket.

C. Experimental Examples

C1. Experimental Example on Gas-Tightness

A plurality of gasket samples having different maximum thicknesses Tmax and hardnesses and being formed of different materials were employed for examining the effects of these factors on gas-tightness. In this experimental example, a spark plug including a gasket was attached to an aluminum bush (i.e., a simulation of an engine block); the spark plug was subjected to repeated heating-cooling cycles (heating to 200° C. and cooling to 20° C. every 30 minutes); and the spark plug was subjected to alternate longitudinal vibration (eight hours) and lateral vibration (eight hours) (total vibration time: 32 hours) under the following ISO vibration conditions. ISO vibration conditions (ISO 11565 (2006)): frequency: 50 to 500 Hz, sweep rate: 1 octave/min, acceleration: 30 G Hereinafter, the aforementioned test performed on the spark plug (i.e., repeated heating and cooling, and vibration) may be referred to as the "durability test."

After completion of the durability test, the temperature of a portion (surface) of the aluminum bush with which the gasket was in contact was adjusted to 200° C., and compressed air was applied to the spark plug from the ignition portion side for a specific period of time. When the amount of air leakage from the gasket was 10 cc or less, gas-tightness was evaluated as being highest, and rating "A" was assigned. When the amount of air leakage from the gasket was more than 10 cc and 20 cc or less, gas-tightness was evaluated as being second highest, and rating "B" was assigned. When the amount of air leakage from the gasket was more than 20 cc, gas-tightness was evaluated as being lowest, and rating "C" was assigned.

FIG. 4 shows, in a table form, evaluation results of gas-tightness. In this experimental example, five samples were prepared under the same conditions, and, among the five samples, the sample showing the poorest results was employed for evaluation. The same shall apply to the below-described other experimental examples.

As is clear from FIG. 4, rating "A" or "B" is assigned in the case where the maximum thickness Tmax of a gasket is 0.4 mm or more. The reason for this is as follows. In the case of a gasket having a maximum thickness Tmax of 0.4 mm or more, even when the gasket is compressed, sufficient stroke is secured. Therefore, the shape difference between the gasket and the engine block can be compensated, and gas-tightness is improved.

As is also clear from FIG. 4, rating "A" is assigned in the case where the maximum thickness Tmax of a gasket is 0.4 mm or more and the hardness thereof is 150 HV or less. The reason for this is as follows. In the case of a gasket having a hardness of 150 HV or less, the surface of the gasket can be appropriately deformed. Therefore, the shape difference between the gasket and the engine block is compensated, and adhesion is improved at the contact surface between the gasket and the engine block or between the gasket and the spark plug, whereby gas-tightness is improved. Thus, the maximum thickness Tmax and hardness of a gasket are preferably 0.4 mm or more and 150 HV or less, respectively.

The indenter force during the Vickers hardness test was 1.96 N.

C2. Experimental Example on Loosening 1

A plurality of gasket samples having different maximum thicknesses Tmax and hardnesses and being formed of different materials were employed for examining the effects of these factors on loosening after completion of the durability test. In this experimental example, the spark plug was removed from the aluminum bush after completion of the aforementioned durability test. When the torque after removal of the spark plug was 50% or more of that during attachment thereof, rating "AA" (i.e., highest evaluation) was assigned. When the torque after removal of the spark plug was 30% or more and less than 50% of that during attachment thereof, rating "A" (i.e., second highest evaluation) was assigned. When the torque after removal of the spark plug was less than 30% of that during attachment thereof, rating "C" (i.e., low evaluation) was assigned.

FIG. 5 shows, in a table form, evaluation results of loosening. As is clear from FIG. 5, rating "AA" or "A" is assigned in the case where the hardness of a gasket is 30 HV or more and the Ni content of the gasket is 0.1 wt. % or more. The reason for this is as follows. When Ni is added to Cu, the resultant Cu alloy exhibits improved stress relaxation resistance, and thus loosening of the gasket can be suppressed. When the hardness is 30 HV or more, since plastic deformation of the gasket can be prevented, loosening of the gasket can be suppressed.

As is also clear from FIG. 5, rating "AA" is assigned in the case where the P content of a gasket is 0.01 wt. % or more. The reason for this is as follows. When P is incorporated, a segregation product containing Ni and P is produced, and thus stress relaxation resistance can be further improved.

Thus, in order to suppress loosening of a gasket, preferably, the hardness of the gasket is 30 HV or more and the Ni content of the gasket is 0.1 wt. % or more, particularly preferably, the P content of the gasket is 0.01 wt. % or more.

Meanwhile, when the amount of Ni, Sn, or P incorporated is large, the resultant Cu alloy exhibits low thermal conductivity. When a spark plug including a gasket having low thermal conductivity is employed for a long period of time, the temperature of the gasket is elevated, and plastic deformation of the gasket proceeds, which causes loosening of the gasket. Therefore, in order to suppress loosening of the gasket, the total amount of Ni, Sn, and P incorporated is preferably 2 wt. % or less.

In the present experimental example, it was found that rating "AA" or "A" is assigned in the case where the hardness of a gasket is 30 HV or more and the Ni content of the gasket is 0.1 wt. % to 10.0 wt. %, and that rating "AA" is assigned in the case where the P content of a gasket is 0.01 wt. % to 0.50 wt. %.

C3. Experimental Example on Screwing Accuracy

A plurality of gasket samples having different maximum thicknesses Tmax and hardnesses and being formed of different materials were employed for examining the effects of these factors on screwing accuracy after repeated screwing/unscrewing cycles. In this experimental example, firstly, the aforementioned durability test was performed. Then, there were performed five screwing/unscrewing cycles, each including removal of the spark plug from the aluminum bush, and reattachment of the spark plug to the aluminum bush at the same screwing torque as the first one.

When the difference between the screwing angle at the first cycle and that at the fifth cycle was +5° or less, rating "A" (i.e., highest evaluation) was assigned, whereas when the difference between the screwing angle at the first cycle and that at the fifth cycle was more than +5°, rating "C" (i.e., low evaluation) was assigned.

FIG. 6 shows, in a table form, evaluation results of screwing accuracy. As is clear from FIG. 6, when the Sn content of a gasket was 0.3 wt. % or more, rating "A" was assigned. The reason for this is as follows. When Sn is incorporated in an amount of 0.3 wt. % or more, the resultant Cu alloy exhibits increased elasticity. Therefore, even when the spark plug is repeatedly screwed and unscrewed, the spark plug exhibits improved positioning accuracy. Thus, in order to improve positioning accuracy after repeated screwing/unscrewing cycles, the Sn content of a gasket is preferably adjusted to 0.3 wt. % or more. In the present experiment example, it was found that rating "A" is assigned in the case where the Sn content of a gasket is 0.3 wt. % to 11.0 wt. %.

C4. Experimental Example on Loosening 2

In the present experimental example, there was examined the relationship between the contact area S of the gasket 5 and loosening of the gasket after completion of the durability test. Specifically, two types of gaskets having different compositions were provided, and a plurality of samples for each type having different contact areas S were prepared. In the present experimental example, 30 samples for each type were prepared under the same conditions.

Each of the thus-prepared samples was subjected to the aforementioned durability test, and the sample (spark plug) was removed from the aluminum bush after completion of the durability test. When the torque after removal of a sample was less than 50% of that during attachment of the sample, it was regarded that loosening occurred in the sample. Thus, the number of samples in which loosening occurred was recorded. Details of the two types of gaskets are as follows. The contact area S was adjusted by changing the outer diameter of a gasket.

Type 1: composition: copper content is 99.90 wt. % or more (containing no Ni), maximum thickness Tmax: 1.5 mm, hardness: 60 HV, inner diameter: 9.5 mm.

Type 2: composition: copper content is 99 wt. % and Ni content is 0.1 wt. %, maximum thickness Tmax: 1.5 mm, hardness: 60 HV, inner diameter: 9.5 mm.

Figures 7, 8:
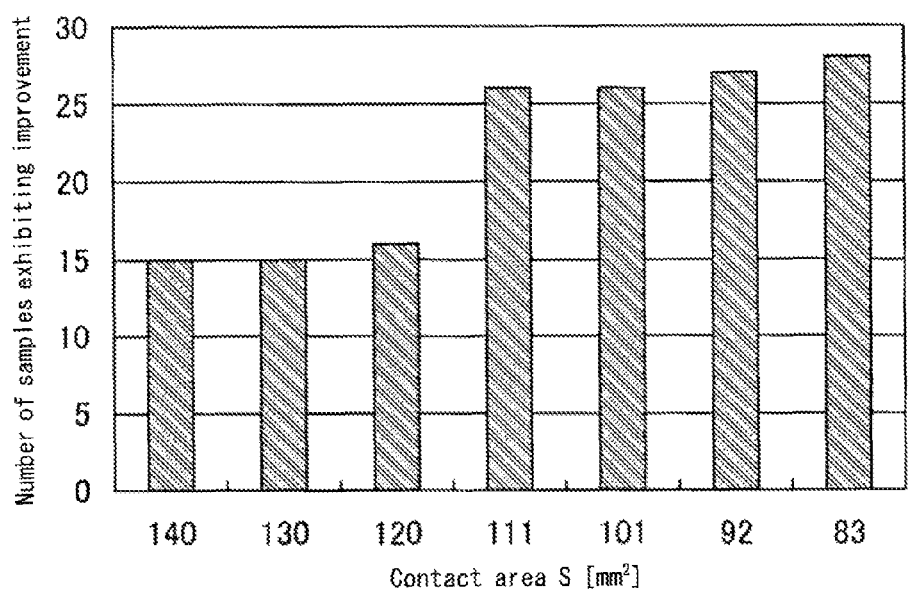
FIG. 7 shows, in a table form, experimental results of loosening.
FIG. 8 shows, in a graph form, the relationship between the contact area S of a gasket 5 and the number of samples exhibiting suppressed loosening.

FIG. 7 shows, in a table form, experimental results of loosening. FIG. 8 shows, in a graph form, the relationship between the contact area S of the gasket 5 and the number of samples exhibiting suppressed loosening. As is clear from FIG. 7, in samples of type 1, loosening is likely to occur in association with a decrease in contact area S, whereas in samples of type 2 (i.e., samples containing Ni), loosening does not occur even when the contact area S of the gasket 5 is small.

As is clear from the number of samples exhibiting suppression of loosening through incorporation of nickel (see FIG. 8), the smaller the contact area S of the gasket 5, the greater the number of samples exhibiting improvement. Specifically, the number of samples exhibiting improvement considerably increases when the contact area S of the gasket 5 is 111 mm$^2$ or less. Thus, these data indicate that a remarkable loosening suppression effect is obtained when the contact area S of the gasket 5 is 111 mm$^2$ or less.

D. Modifications

The present invention is not limited to the aforementioned examples and embodiments, and various other embodiments may be implemented without departing from the scope of the invention. For example, the below-described modifications may be carried out.

D1. Modification 1

In each of the gaskets according to the aforementioned embodiments, the protrusion 5g or the groove 5x is provided. However, these may be omitted.

D2. Modification 2

In each of the spark plugs according to the aforementioned embodiments, the direction of discharge corresponds to the axial direction OD. However, the present invention may be applied to a spark plug in which the direction of discharge is perpendicular to the axial direction OD; i.e., a so-called lateral-discharge-type spark plug.

D3. Modification 3

In each of the spark plugs according to the aforementioned embodiments, the center electrode tip 90 and the ground electrode tip 95 are provided. However, one or both of these tips may be omitted.

DESCRIPTION OF REFERENCE NUMERALS

3: ceramic resistor
4: sealing body
5: gasket
5b: gasket
5g: protrusion
5x: groove
6: ring member
8: plate packing
9: talc
10: insulator
11: forward end portion
12: axial hole
13: elongated leg portion
15: support portion
17: forward-end-side body portion
18: rear-end-side body portion
19: flange portion
20: center electrode
21: electrode matrix
22: forward end portion
25: core member
30: ground electrode
32: proximal portion
33: distal end portion
40: terminal shell
50: metallic shell
51: tool engagement portion
52: threaded attachment portion
53: crimp portion
54: sealing portion
56: stepped portion
57: forward end portion
58: buckling portion
59: screw neck
90: center electrode tip
95: ground electrode tip
100: spark plug
200: engine head
201: threaded attachment hole
G: spark discharge gap
OD: axial direction
CL: clearance

The invention claimed is:
1. A spark plug comprising:
a tubular metallic shell extending in an axial direction; and
an annular gasket defining a hole that extends through the annular gasket from an upper surface to a lower surface, the annular gasket provided around the metallic shell, the spark plug being characterized in that:
the gasket is solid and contains copper as a main component and nickel in an amount of 0.10 wt. % to less than 0.80 wt. %;
the gasket has a maximum thickness of 0.4 mm or more in the axial direction;
the gasket has a Vickers hardness of 30 HV to 150 HV; and the upper surface of the gasket is in contact with the metallic shell and has an area of 92 mm$^2$ or less.

2. The spark plug according to claim 1, wherein the gasket further contains phosphorus in an amount of 0.01 wt. % to 0.50 wt. %.

3. The spark plug according to claim 1, wherein the gasket further contains tin in an amount of 0.30 wt. % to 11.00 wt. %.

4. The spark plug according to claim 1, wherein the gasket contains one or more elements selected from among nickel, phosphorus, and tin, the one or more elements including at least nickel; and the total amount of the one or more elements is 2.00 wt. % or less.

5. The spark plug according to claim 2, wherein the gasket further contains tin in an amount of 0.30 wt. % to 11.00 wt. %.

6. The spark plug according to claim 2, wherein the gasket contains one or more elements selected from among nickel, phosphorus, and tin, the one or more elements including at least nickel; and the total amount of the one or more elements is 2.00 wt. % or less.

7. A spark plug comprising:
   a tubular metallic shell extending in an axial direction; and
   an annular gasket defining a hole that extends through the annular gasket from an upper surface to a lower surface, the annular gasket provided around the metallic shell, the spark plug being characterized in that:
   the gasket is solid and contains copper as a main component and nickel in an amount of 0.10 wt. % or more;
   the gasket has a maximum thickness of 0.4 mm to less than 1.5 mm in the axial direction;
   the gasket has a Vickers hardness of 30 HV to 150 HV; and
   the upper surface of the gasket is in contact with the metallic shell and has an area of 92 mm$^2$ or less.

* * * * *